United States Patent [19]
Collins

[11] 4,053,933
[45] Oct. 11, 1977

[54] ADAPTIVE PHASE LOCKED LOOP FILTER FOR TELEVISION TUNING

[75] Inventor: Johnny Collins, Oak Park, Ill.

[73] Assignee: Zenith Radio Corporation, Glenview, Ill.

[21] Appl. No.: 737,945

[22] Filed: Nov. 2, 1976

[51] Int. Cl.² .................. H03B 3/04; H04N 5/44
[52] U.S. Cl. .................. 358/191; 325/464; 325/421; 331/17; 331/25
[58] Field of Search ............ 331/17, 18, 25, 4; 325/419, 421, 423, 453, 464; 328/167; 307/295; 358/191

[56] References Cited
U.S. PATENT DOCUMENTS

| | | | |
|---|---|---|---|
| 3,316,497 | 4/1967 | Brooks | 331/17 |
| 3,694,776 | 9/1972 | Linder | 331/17 X |
| 3,701,039 | 10/1972 | Lang et al. | 331/17 X |
| 3,701,059 | 10/1972 | Nyswander | 328/167 X |
| 3,939,438 | 2/1976 | Taylor | 331/17 X |
| 3,946,148 | 3/1976 | Skerlos | 325/421 X |
| 3,980,969 | 9/1976 | Stengel | 331/17 |

*Primary Examiner*—Siegfried H. Grimm
*Attorney, Agent, or Firm*—Jack Kail

[57] ABSTRACT

A low-pass filter useful in association with a phase locked loop for controlling the frequency of a voltage controlled oscillator on the basis of an error signal resulting from a comparison between a reference signal and the oscillator's output. The low-pass filter comprises means responsive to the error signal for developing an output current for charging or discharging a capacitive network according to the frequency and phase deviations represented by the error signal. For large frequency and phase deviations extended charging or discharging currents provide high acquisition speeds whereas, as the frequency and phase deviation represented by the error signal decreases, drastically reduced charging or discharging currents result thereby effectively reducing the bandwidth of the filter for facilitating reference signal sideband supression as frequency "lock-on" is approached and when phase lock is achieved.

11 Claims, 4 Drawing Figures

ADAPTIVE PHASE LOCKED LOOP FILTER FOR TELEVISION TUNING

CROSS REFERENCE TO RELATED PATENT APPLICATION

This application claims material originally disclosed in related copending application Ser. No. 718,746, filed Aug. 30, 1976 entitled WIDE WINDOW TUNING SYSTEM in the name of Akio Tanaka and copending application Ser. No. 734,483, filed Oct. 21, 1976 entitled HIGH SPEED TUNING SYSTEM in the name of Richard Merrell, both assigned to Zenith Radio Corporation and both of which are hereby incorporated by reference.

BACKGROUND OF THE INVENTION

This invention relates to filter circuits and, more particularly, to low-pass filter circuits of the type suitable for use in a phase locked loop (PLL).

PLL's find utility in numerous applications where it is desired to generate signals having controllable frequency characteristics. For example, in television tuning systems of the electronic type it is typically necessary to develop tuning voltages for application to one or more tuning elements in order to establish a local oscillator frequency (LOF) corresponding to a selected television channel. For viewer convenience the LOF corresponding to the selected channel should be acquired or "locked onto" as quickly as possible. For this purpose, it has been found useful to initially develop a tuning voltage for application to the tuning elements which cause them to rapidly approach the desired LOF and to subsequently stabilize tuning under the influence of a PLL. Following tuning stabilization, system tuning may be maintained by the PLL or, alternatively, turned over to an automatic frequency control system. In either event, the use of the PLL to facilitate system tuning is an extremely useful technique.

Conventional phase locked loops include a voltage controlled oscillator (VCO) for developing an output signal having a frequency $f_O$ which is fed back to one input of a phase detector or comparator, the other input of the phase comparator being supplied with a reference signal having a frequency $f_{ref}$ from a crystal reference or the like. Based on the frequency and phase deviation between the oscillator output signal and the reference signal, the phase comparator develops an error signal, usually a series of pulses, which is applied through a low-pass filter to the VCO in a corrective direction to cause the frequency $f_O$ of its output to stabilize at a value equivalent to the frequency $f_{ref}$ of the reference signal.

It is also known in the prior art to utilize a programable divider or the like in the feedback loop between the oscillator and the phase comparator to provide for an increased range of output signals. That is, since the reference signal has a constant frequency, the VCO output can be made to equal any integral multiple of the reference signal frequency by setting the division factor of the divider to a particular value. Thus, the frequency $f_O$ of the oscillator output can be made to equal $Nf_{ref}$ where N is the division factor of the feedback divider.

It is further known that the fundamental characteristics of a PLL are controlled primarily by the loop's lowpass filter. For example, to achieve a reasonably low capture time, i.e., a high acquisition speed, it is preferable to utilize a low capacitance network capable of rapidly charging or discharging to a desired tuning voltage for controlling the oscillator. However, the use of a low capacitance charging and discharging network results in increased loop bandwidth which tends to compromise reference signal sideband suppression. In a television system, the failure to adequately suppress reference signal sidebands from being applied through the filter to the VCO may result in serious degradation of the displayed picture.

In order to accomodate the conflicting requirements for high acquisition speed and good reference signal sideband suppression it has heretofore been necessary to make certain design trade-offs. That is, for example, by somewhat reducing the acquisition speed, an acceptable level of reference signal sideband suppression my be achieved. It is also known to use a reference signal having a relatively high frequency to facilitate reference signal sideband suppression by the low-pass filter without unduly compromising acquisition speed. Unfortunately, the use of a high frequency reference signal necessitates the use of relatively expensive, high-speed semiconductor technology to perform, for example, counting operations, and, even so, acquisition speed is frequently compromised to an unacceptable degree.

SUMMARY OF THE INVENTION

In accordance with the foregoing it is a primary object of the present invention to provide a filter for facilitating the use of a phase locked loop in a television tuning system.

It is another object of the present invention to provide a low-pass filter suitable for use with a phase locked loop for enabling high acquisition speeds without compromising reference signal sideband suppression.

Yet another object of the present invention is to provide a low-pass filter of the foregoing type which is operable in association with a relatively low frequency reference signal so as to enable the use of low-speed semiconductor technology.

In accordance with these and other useful objects there is provided a novel low-pass filter which is connected intermediate the phase comparator and VCO (the local oscillator of the television tuning system) of a PLL. The filter is responsive to an error signal supplied from the phase comparator by developing a tuning voltage for causing the oscillator to "lock on" to the LOF corresponding to a selected television channel, the error signal being generated by the phase comparator as the result of a comparison between the frequency and phase of the oscillator output, or a divided version thereof, and that of a constant reference signal.

The low-pass filter itself essentially comprises a capacitive network for developing the tuning voltage, the capacitive network being connected to the output of an amplifying device of the type having, in addition to the usual differential input terminals, an independent gain control input terminal. Both the differential input terminals and the gain control input terminal are connected for receiving the error signal from the phase comparator. Amplifying devices of this type are frequently referred to in the art as operational transconductance amplifiers (OTA's) and develop an output current having a direction dependent upon the polarity of the input signal applied to its differential input terminals. The magnitude and average value of the output current are controllable by the bias current supplied to the amplifier's gain control input terminal. In addition, an integrating circuit is connected to the gain control input of the OTA and suitable impedance matching means may be utilized where appropriate.

In order to achieve high channel acquisition speeds, the television tuning system, as described in the above-mentioned copending applications, initially causes a continuous DC signal to be applied to both inputs of the amplifying device. As a result, the capacitive network rapidly charges or discharges to a tuning voltage near the voltage required for achieving the LOF corresponding to the selected television channel. Therefore, in this mode, the amplifying device is operating as a voltage controlled current source.

Subsequently, tuning is accomplished under the influence of the PLL wherein the error signal, typically a series of variable width pulses, is processed by the low-pass filter to provide the necessary correction in the tuning voltage to lock the frequency of the VCO to the desired frequency. Since the error signal is coupled to both control inputs of the amplifying device, an output current for charging or discharging the capacitive network is developed only during the occurrence of a pulse, the amplifying device being cut-off between pulses. Therefore, during the PLL mode of operation the amplifying device is operating as a pulse width modulated sample and hold circuit.

It will be appreciated that the pulse widths of the error signal pulses during the initial phase of the PLL mode are relatively large but tend to narrow considerably, thereby shortening the sampling intervals of the amplifying device, as "lock-on" is approached. It is well known that the amplitude spectrum associated with the Fourier transform of a pulsating signal reduces as the pulse widths narrow. Accordingly, as "lock-on" is approached, the amplitude spectrum of the narrower error signal pulses is relatively small enabling effective attenuation thereof by the capacitive network facilitating the suppression of reference signal sidebands. In addition, while the wider error signal pulses result in pulses of output current applied to the capacitive network for correcting the tuning voltage, the integrating circuit effectively limits the amplitude of the narrower pulses to a value wherein the OTA remains substantially cut-off blocking the transmission of signals through the filter. By reducing the gain controlling effect of the error signal pulses on the amplifying device as "lock-on" is approached, the bandwidth of the filter is effectively reduced which further facilitates reference signal sideband suppression.

After "lock-on" has been achieved, the tuning system may either remain in the PLL mode of operation or, may be placed under control of an automatic frequency control circuit which applies a correction signal to the VCO through the lowpass filter.

DESCRIPTION OF THE PREFERRED EMBODIMENT

Figure 1:
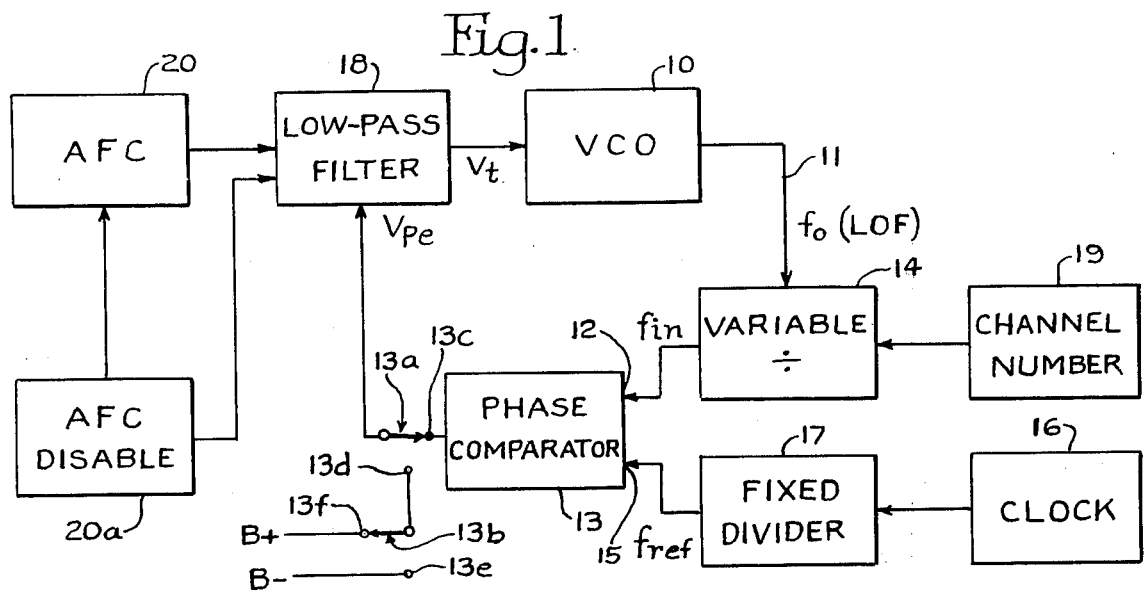
FIG. 1 is a block diagram illustrating a phase locked loop suitable for use in the tuning section of a television receiver with an optional AFC system.

Referring now to the drawings and, in particular, to FIG. 1, the PLL comprises a voltage controlled oscillator 10 having an output 11, at which appears a frequency $f_O$. Output 11 is applied to a variable frequency divider 14 which develops a signal $f_{in}$ at one input 12 of a phase comparator 13. A reference signal, characterized by a frequency $f_{ref}$, is applied to a second input 15 of phase comparator 13 from a clock 16 through a fixed frequency divider 17. The output $V_{pc}$ of phase comparator 13, which is typically a series of pulses representing the frequency and phase deviation between $f_{in}$ and $f_{ref}$, is applied to low-pass filter 18. Low-pass filter 18 responsively develops from the phase comparator output $V_{pc}$ a tuning voltage $V_t$ for corrective application to VCO 10. The tuning voltage $V_t$ adjusts the VCO to equalize the frequency and phase of the input signals to phase comparator 13.

It will be appreciated that in a television receiver output 11 of VCO 10, which may typically include voltage responsive tuning elements such as varactor diodes, comprises the local oscillator signal. In addition, it will be understood that tuning voltage $V_t$ may also be applied to other tuned stages of the receiver tuner.

Since each broadcast channel necessitates a different LOF, frequency $f_O$ is appropriately variable. For comparison purposes, frequency $f_{in}$ must always be drivable toward a fixed value coinciding with the frequency $f_{ref}$ of the reference signal. This is accomplished by means of variable divider 14 in association with block 19 labeled channel number select. The primary purpose of channel number select 19 is to set the division factor N of the variable divider 14 such that the local oscillator frequency $f_O$ corresponds to the selected channel when the frequency and phase of $f_{in}$ equals the frequency and phase of reference signal $f_{ref}$. Therefore, the frequency $f_O$ can be expressed as $Nf_{ref}$ where N is appropriately variable for achieving the local oscillator frequencies necessary to tune selected television channels.

Prior to PLL tuning, it may be desirable to rapidly ramp tuning voltage $V_t$ toward a value corresponding to the desired LOF. Switches 13a and 13b, along with associated contacts 13c, 13d, 13e and 13f, enable selective operation of lowpass filter 18 in either a PLL or 100% ramp mode. Circuitry for automatically implementing the action of switches 13a and 13b is fully disclosed in the copending applications.

Furthermore, after PLL tuning has been accomplished, it may be desirable to maintain system tuning under the control of an automatic frequency control circuit. Accordingly, an automatic frequency control circuit 20 is shown for controlling the development of tuning voltage $V_t$ through the low-pass filter 18. Since AFC is incompatible with phase-locked-loop tuning, an AFC disable circuit 20a is shown for disabling the AFC during PLL operation.

Figure 2:
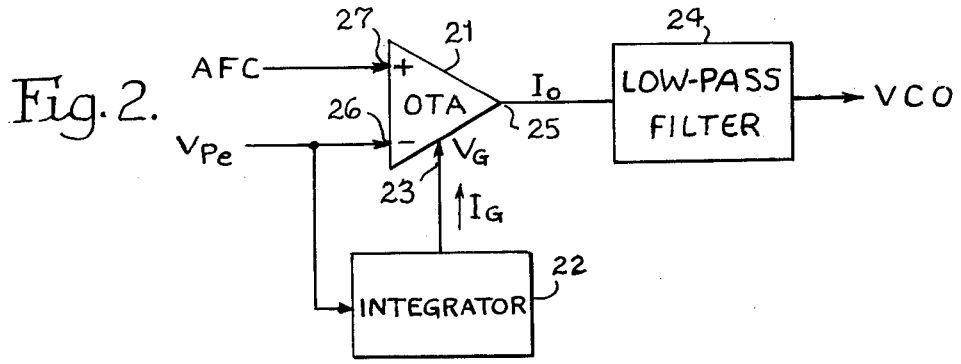
FIG. 2 is a block diagram of the inventive lowpass filter of the phase locked loop generally shown in FIG. 1.
Figure 3:
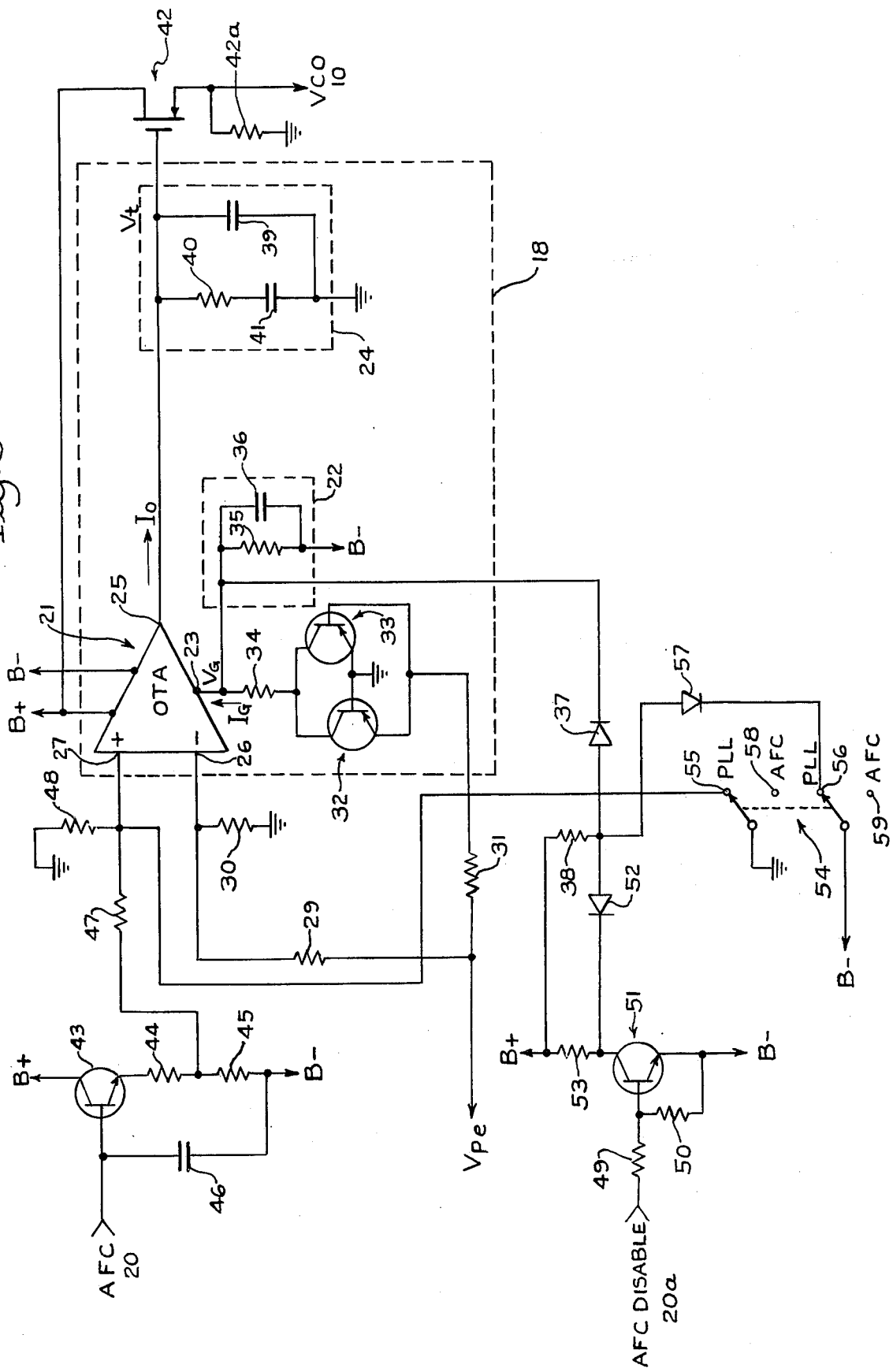
FIG. 3 is an electrical schematic diagram of the lowpass filter shown in block form in FIG. 2.

FIGS. 2 and 3 disclose the preferred embodiment of low-pass filter 18, which overcomes many of the problems associated with prior art PLL's. Referring to FIG. 2, lowpass filter 18 comprises an operational transconductance amplifier (OTA) 21, an integrating circuit 22 for supplying a gain control input terminal 23 of OTA 21 and a tuning voltage low-pass filter 24 connected to an output terminal 25 of the OTA. Error signal $V_{pc}$ from phase comparator 13 is supplied to an inverting input 26 of the OTA and to integrating circuit 22. A non-inverting input 27 of the OTA is grounded for PLL operation. Tuning voltage $V_t$ is developed by tuning voltage low-pass filter 24 for application to the VCO 10.

OTA 21 which, for example, may be an RCA type number CA 3080, is similar to a conventional operational amplifier in that it includes differential input terminals 26 and 27. In addition, the OTA includes an independent control terminal 23 for controlling the gain of the device. The OTA can be operated either as a current source or a current sink, depending on the polarity of the signal applied to its differential inputs for developing a current $I_O$ at output 25 controllable by the bias current $I_g$ applied to its gain control input 23. To develop maximum output current $I_O$ the bias current $I_g$ must be maximized. To cut-off the OTA, the bias current $I_g$ is reduced to near zero. When cut-off, the OTA characteristically exhibits an extremely high output impedance at 25 (approximately 1,000 megohms).

Known uses of OTA's include their operation as fixed duration sample and hold circuits. Such may be accomplished by connecting a signal storage device, e.g., a capacitor, to the amplifier's output and supplying the signal to be sampled to its differential inputs. A fixed duration pulsating sampling signal is then applied to the OTA's gain control input for developing a bias current for alternately cutting off and turning on the amplifier. In this manner the signal applied to the differential inputs is sampled each time the OTA is turned on with the sampled value of the signal being stored in the output capacitor. Similarly, it is known to operate an OTA as an amplitude modulator by applying a carrier signal to its differential inputs while the modulating signal is applied to the device's gain control input.

The detail implementation of low-pass filter 18 embodying OTA 21 is shown in FIG. 3. Error signal $V_{pe}$ from phase comparator 13 is applied to inverting input 26 of OTA 21 through a voltage divider comprising a resistor 29 and a grounded resistor 30. The error signal $V_{pe}$ is also coupled through a resistor 31, a pair of transistors 32 and 33 (connected in a rectifying configuration) and a resistor 34 to gain control input 23. Also connected to gain control input 23 is one end of integrating circuit 22 comprising a parallel combination of a resistor 35 and a capacitor 36. The remaining end of integrator 22 is connected to a supply of negative DC potential B—. Finally, in order to facilitate operation of OTA 21 during non-PLL modes, gain control input 23 is connected to a source of current via positive DC supply potential B+ through a diode 37 and a resistor 38.

Current $I_O$ developed at output 25 of OTA 21 is effective for appropriately charging or discharging the capacitive tuning voltage filter 24. Tuning voltage filter 24 is connected between ground and output 25 and comprises a parallel combination of a capacitor 39 and a series connected resistor 40 and a capacitor 41. Tuning voltage $V_t$, developed at output 25 by filter 24, is applied to the gate electrode of a source follower FET 42. FET 42, which functions as an impedance converter, has its source electrode connected to ground through a resistor 42a and to the tuning elements of the VCO and its drain electrode connected to B+.

Automatic frequency control (AFC) signals developed by the television receiver are preferably applied through appropriate buffering and signal conditioning circuitry to non-inverting input 27 of OTA 21. Accordingly, AFC signals are coupled to a low-pass buffer stage comprising a transistor 43 which has its emitter coupled through a pair of series connected resistors 44 and 45 to B—. A filter capacitor 46 is connected between the base of transistor 43 and B—. The collector of transistor 43 is connected to B+. The junction formed by resistors 44 and 45 is connected, through a voltage divider comprising a resistor 47 and a grounded resistor 48, to non-inverting input 27 of OTA 21.

To properly condition PLL low-pass filter 18 for non-PLL operation, AFC Disable 20a generates a signal which is coupled through a pair of resistors 49 and 50 to the base of a transistor 51. The emitter of transistor 51 is connected to B— and its collector is connected through a diode 52 to the anode of a diode 37 and through a resistor 53 to B+. A resistor 38 is connected from B+ to the junction of the anodes of diodes 52 and 37.

Finally, to facilitate selective operation of system in PLL and AFC modes a ganged double pole, double throw switch 54 is provided. For PLL operation the poles of switch 54 engage contacts 55 and 56 to ground the junction between resistors 47 and 48 and supply B— potential to the junction of diodes 37 and 52. The AFC mode of operation is obtained when poles of switch 54 engage contacts 58 and 59. The circuitry for accomplishing the switchover is fully described in the copending applications.

Figure 4:
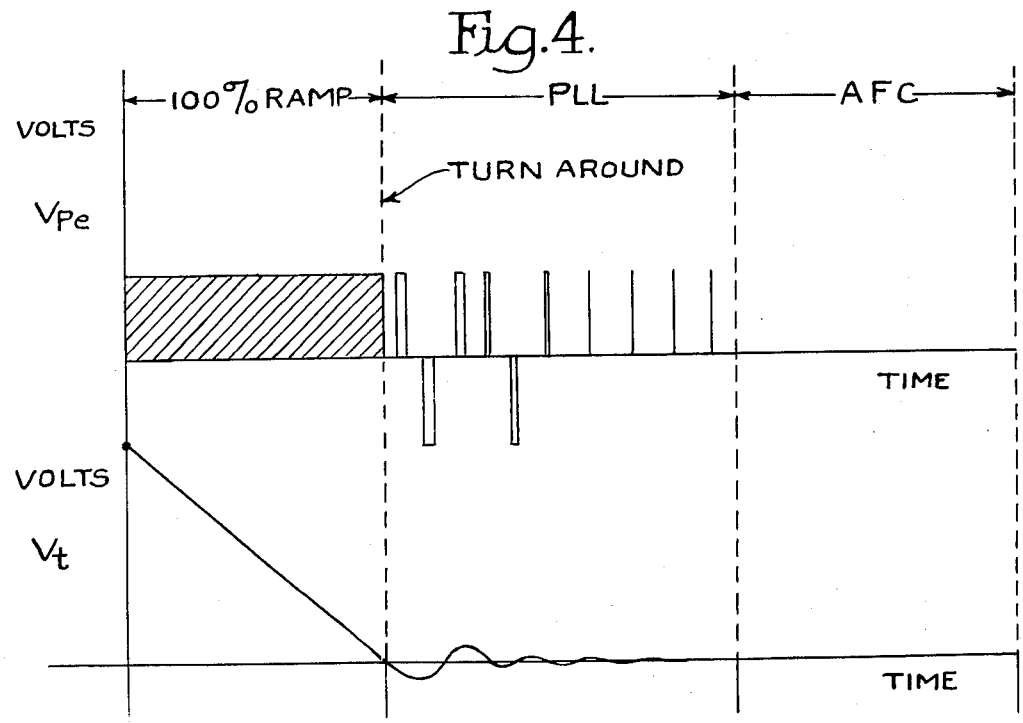
FIG. 4 is a graphical representation of the waveforms of the input and output signals of the low-pass filter shown in FIGS. 2 and 3.

Operation of the low-pass filter 18 of the present invention is conveniently explained with the aid of the graphical representation of FIG. 4. As previously explained it is normally important, and particularly so in television tuning applications, to provide a loop having a high channel acquisition speed or, stated otherwise, a low capture time. To achieve this result, the loop may initially be operated in a 100% ramp mode wherein the error signal $V_{pe}$ comprises a continuous DC signal having a polarity determined by the frequency relationship between the signals applied to the two inputs of the comparator 13. The 100% ramp mode of operation is achieved by causing switch 13a to engage contact 13d and by causing switch 13b to engage either contact 13e or 13f. Also, during the 100% ramp mode of operation, as well as the subsequent PLL mode of operation, the AFC disable signal applied to transistor 51 is at a logically high level causing the transistor to conduct whereby diode 37 is reverse biased to prevent the conduction of current therethrough to gain control input 23. Consequently, since the AFC system is also inhibited at this time, the only signal being applied to the low-pass filter 18 is the continuous DC error signal $V_{pe}$. This signal, i.e., $V_{pe}$, is supplied to inverting input 26 of OTA 21 and its polarity determines the direction of current $I_O$ developed at output 25. That is, for a positive $V_{pe}$, indicating a VCO frequency higher than that desired, OTA 21 will act as a current sink. For a negative $V_{pe}$, indicating that the VCO frequency is lower than the desired frequency, the OTA will function as a current source. The continuous DC $V_{pe}$ error signal is also applied to the junction formed by the emitter of transistor 32 and the base of transistor 33. A high $V_{pe}$ saturates transistor 32 providing a maximum bias current $I_g$ to gain control input 23 of OTA 21. Similarly, if $V_{pe}$ is low, transistor 33 saturates again providing a maximum bias current $I_g$ to the OTA gain control input 23. Therefore, during the 100% ramp mode of operation maximum DC output current is developed by OTA 21 at output 25.

The output current $I_O$ developed at output 25 of OTA 21 rapidly charges or discharges tuning voltage low-pass filter 24 such that a ramped tuning voltage $V_t$ is developed at the gate electrode of FET 42 and coupled thereby to the tuning elements of the VCO 10. After phase comparator 13 detects that the frequency of VCO 10 is close to the desired frequency, frequently referred to as "turn around", normal PLL operation is initiated, switch 13a being caused to engage contact 13c, wherein the error signal $V_{pe}$ comprises a series of pulses having pulse widths representing the deviation between the frequency of VCO 10 and the desired frequency.

During the PLL mode OTA 21 is being operated as a pulse width modulated sample and hold circuit. That is, the variable width $V_{pe}$ error signal pulses, whose amplitudes are normally sufficient to fully turn-on the OTA, applied to gain control input 23 tend to cause OTA 21 to sample the input applied to differential inputs 26 and 27 for the duration of each of the pulses. Since the polarity of the error signal pulses applied to inverting input 26 determine the direction of output current $I_O$, during each sample interval OTA 21 appropriately charges or discharges voltage tuning filter 24 to correct the value of the tuning voltage $V_t$. During the intervals between occurrences of $V_{pe}$ error signal pulses OTA 21 is cut-off and characteristically exhibits an extremely high output impedance. Due to the high input impedance of FET 42 voltage tuning filter 24 exhibits very little leakage whereby tuning voltage $V_t$ is maintained nearly constant and error signal pulses of only short duration are required to maintain the tuning voltage $V_t$.

During the initial phase of PLL operation the $V_{pe}$ error signal pulses are relatively wide and result in current pulses at output 25 of relatively long duration. Since the amplitude spectrum associated with the Fourier transform of a pulsating signal is relatively high for large pulse widths, high level harmonics of the reference signal are transmitted through the OTA to tuning voltage filter 24 where they frequency modulate VCO 10. Although tuning voltage filter 24 filters some of the higher frequency harmonics, much of the lower frequency harmonics are passed through filter 24 to frequency modulate the VCO. Fortunately, the video degradation resulting from frequency modulating the VCO is not discernable at this time, i.e., while the $V_{pe}$ error signal pulses are relatively wide, because of the finite time required to make a channel selection.

As the frequency of VCO 10 approaches the desired frequency, the $V_{pe}$ error signal pulses become extremely narrow and, consequently, the amplitudes of the reference signal harmonics applied to the OTA are reduced. The brief output current spikes from OTA 21 resulting from the narrow $V_{pe}$ pulses are therefore characterized by a reduced amplitude spectrum which, upon being low-pass filtered by voltage tuning filter 24, do not appreciably effect VCO 10. As a result, reference signal sideband suppression is increased as the $V_{pe}$ error signal pulses decrease in width and "lock-on" is approached.

In addition, integrating circuit 22 is operative to further facilitate reference signal sideband suppression. Integrating circuit 22 integrates the $V_{pe}$ error signal pulses applied to OTA gain control input 23 thereby reducing the conduction or sampling interval of the OTA in response to the pulses. Since the wider $V_{pe}$ pulses will reach their maximum amplitude regardless of integrator 22 only minimal reductions in the sampling intervals of the OTA will result during the initial phase of PLL operation. The actual reduction is measured by the time interval between the occurrence of a $V_{pe}$ pulse and the time which capacitor 36 requires to charge to a level sufficient to cause the OTA to turn on. However, as "lock-on" is approached integrator 22 will prevent the narrower $V_{pe}$ pulses from reaching an amplitude at gain control input 23 sufficient to fully turn on the OTA. Thus, by effectively limiting the amplitude of the narrower $V_{pe}$ pulses to a value wherein the OTA remains substantially cut-off the transmission of reference signal sidebands to voltage tuning filter 24 will be blocked as "lock-on" is approached. By this technique the frequency response of low-pass filter 18 is adjusted as "lock-on" is approached by reducing its bandwidth to achieve reference signal side-band suppression. That is, as the duty cycle of the error signal $V_{pe}$ decreases, the effective time constant of filter 18 increases preventing transmission of reference signal sidebands through filter 18.

If desired, following PLL operation the tuning system may be controlled by the AFC signals developed by the television receiver. In this case, the AFC disable signal goes logically low cutting off transistor 51 so that a continuous amplifier bias current is supplied to the OTA gain control input 23 from B+ through resistor 38 and diode 37. Since phase comparator 13 is disabled, the signals applied to the OTA's non-inverting input 27 control tuning operation.

The television receiver AFC circuits are adapted to develop a nominal voltage AFC signal, e.g., 2.5 volts, when the LOF is at the desired frequency. Circuit components are selected such that when a 2.5 volt signal is applied to the base of transistor 43 a zero level voltage signal is developed at the junction between resistors 44 and 45 and applied therefrom to non-inverting input 27 of the OTA. Since, for AFC operation, the OTA inverting input 26 is grounded through resistor 30 no corrective action will be taken by the tuning system. However, when the AFC voltage applied to transistor 43 is disparate from the nominal tuning voltage OTA 21 will charge or discharge filter 24 tending to re-establish the nominal AFC voltage. In the AFC mode, OTA 21 therefore functions as a linear amplifier.

Typically, the VCO 10 will include a plurality of DC responsive varactor diodes. The varactor diodes may self-bias at low tuning voltages and generate rectified DC signals which increase loop instability. FET 42 is provided for eliminating this problem by acting as an impedance converter for providing a low impedance drive to the varactor diodes while providing a high impedance match for the output of OTA 21.

It will be appreciated that the foregoing system provides means for achieving high channel acquisition speed without degrading the video signal by frequency modulating the VCO with reference signal harmonics. In addition, since a reference signal having a relatively low frequency, typically about 1 kilohertz, can be utilized; the system may be implemented through the use of inexpensive slow speed semiconductor technology.

While particular embodiments of the invention have been shown and described, it will be obvious to those skilled in the art that changes and modifications may be made without departing from the invention in its broader aspects, and, therefore, the aim in the apended claims is to cover all such changes and modifications as fall within the true spirit and scope of the invention.

What is claimed is:

1. In a phase locked loop of the type having a phase comparator developing an error signal for controlling the output of a voltage controlled oscillator through a low-pass filter, the improved low-pass filter comprising:

amplifying means having a directional control input and a gain control input both connected for receiving said error signal, said amplifying means being operable for developing an output current having a direction and duty cycle determined by, respectively, the polarity of said error signal applied to said directional control input and the pulse width of said error signal applied to said gain control input; and a capacitive network connected for charging and discharging in response to said output current for controlling the output of said voltage controlled oscillator.

2. The improved low-pass filter according to claim 1 wherein said amplifying means comprises an operational transconductance amplifier.

3. The improved low-pass filter according to claim 1 wherein said error signal is developed on the basis of the comparison between the output of said voltage controlled oscillator and a relatively low frequency reference signal and including means in association with said gain control input for reducing the duty cycle controlling effect of said error signal on said amplifying means as the frequency and phase of the output of said voltage controlled oscillator approaches the frequency and phase of said reference signal so as to facilitate reference signal sideband suppression.

4. The improved low-pass filter according to claim 3 wherein said means for reducing the duty cycle controlling effect of said error signal comprises an integrating network connected to said gain control input for cutting-off said amplifying means as the output of said voltage controlled oscillator approaches the frequency and phase of said reference signal.

5. The improved low-pass filter according to claim 1 wherein said error signal comprises a series of pulses and including rectifying means connected between said gain control input of said amplifying means and said phase comparator.

6. The improved low-pass filter according to claim 1 wherein said amplifying means is characterized by a high output impedance and including means for matching said high output impedance to the tuning elements of said voltage controlled oscillator.

7. In a television receiver tuning system of the type having a phase comparator developing an error signal for controlling the output of a voltage controlled oscillator in response to the low-pass filter of a phase locked loop to achieve tuning of a selected television channel, said phase locked loop including a reference signal, the improvement wherein said low-pass filter comprises;

a. a capacitive network connected for developing a tuning voltage for controlling the frequency of said voltage controlled oscillator; and b. control means responsive to said error signal and operable as a current source or sink for rapidly charging or discharging said capacitive network toward a certain voltage corresponding to a particular frequency in said selected television channel;

c. said control means being also operable in response to said error signal and under the control of said phase locked loop as a pulse width modulated sample and hold circuit for adjusting said tuning voltage for achieving said certain voltage while facilitating reference signal sideband suppression.

8. The improved low-pass filter according to claim 7 wherein said reference signal is characterized by a relatively low frequency and wherein said control means includes means for reducing the bandwidth of said low-pass filter for facilitating reference signal sideband suppression as said tuning voltage approaches said certain voltage.

9. The improved low-pass filter according to claim 7 wherein said control means is further operable as a linear amplifier for applying automatic frequency control signals to said capacitive network for maintaining said tuning voltage at a level corresponding to a restricted frequency range about said particular frequency.

10. The improved low-pass filter according to claim 7 wherein said control means comprises an operational transconductance amplifier having a pair of differential inputs and a gain control input and including means for applying said error signal to said differential inputs and to said gain control input.

11. The improved low-pass filter according to claim 10 including an integrating circuit connected in association with said gain control input.

* * * * *